(12) United States Patent
Milsom et al.

(10) Patent No.: US 7,474,174 B2
(45) Date of Patent: Jan. 6, 2009

(54) LADDER-TYPE THIN-FILM BULK ACOUSTIC WAVE FILTER

(75) Inventors: Robert Frederick Milsom, Redhill (GB); Hans Peter Löbl, Monschau-Imgenbroich (DE)

(73) Assignee: NXP B.V., Eindhoven (NL)

( * ) Notice: Subject to any disclaimer, the term of this patent is extended or adjusted under 35 U.S.C. 154(b) by 316 days.

(21) Appl. No.: 10/574,434

(22) PCT Filed: Sep. 24, 2004

(86) PCT No.: PCT/IB2004/051851

§ 371 (c)(1), (2), (4) Date: Apr. 3, 2006

(87) PCT Pub. No.: WO2005/034349

PCT Pub. Date: Apr. 14, 2005

(65) Prior Publication Data

US 2007/0120624 A1    May 31, 2007

(30) Foreign Application Priority Data

Oct. 6, 2003    (EP) .................................. 03103695

(51) Int. Cl.
*H03H 9/64*    (2006.01)
*H03H 9/72*    (2006.01)

(52) U.S. Cl. ...................................... 333/189; 333/133

(58) Field of Classification Search ................... 333/189
See application file for complete search history.

(56) References Cited

U.S. PATENT DOCUMENTS

| 5,231,327 | A | * | 7/1993 | Ketcham ..................... 310/366 |
| 5,260,675 | A | | 11/1993 | Ogawa et al. |
| 5,942,958 | A | * | 8/1999 | Lakin .......................... 333/189 |
| 6,262,637 | B1 | * | 7/2001 | Bradley et al. .............. 333/133 |
| 6,323,744 | B1 | * | 11/2001 | Barber et al. ............... 333/189 |
| 6,909,340 | B2 | * | 6/2005 | Aigner et al. ............... 333/189 |

FOREIGN PATENT DOCUMENTS

| WO | WO 01/97375 | | 12/2001 |
| WO | WO 02/43243 | * | 5/2002 |

* cited by examiner

*Primary Examiner*—Barbara Summons

(57) ABSTRACT

A ladder filter comprising a plurality of bulk acoustic wave resonators, the resonators comprising a plurality of series resonators series resonators in series between an input terminal and an output terminal of the filter, and one or more shunt resonators each connected between a junction between two series resonators and a common terminal, the series resonators comprising an input series resonator connected to the input terminal and an output series resonator connected to the output terminal, and wherein the shunt resonators are designed to satisfy: a unity aspect ratio and wherein the series resonators are designed to satisfy an aspect ratio different from unity. The aspect ratio is defined as the ratio of length to width of the resonator.

4 Claims, 5 Drawing Sheets

Cross-section A-B

LADDER-TYPE THIN-FILM BULK ACOUSTIC WAVE FILTER

The present invention relates generally to the field of radio frequency (RF) apparatus, in particular to radio frequency filters and more particularly to filters constructed using thin film bulk acoustic wave resonators. Such filters may be used in communication equipment as band-pass filters which enable selection of a frequency band in which transmission channels are located, and with rejection of frequencies outside the band of interest. The invention also relates to communications equipment e.g., a radio frequency receiver and/or transmitter comprising such filters.

High-performance radio-frequency filters typically use high dielectric constant ceramic resonators or surface acoustic wave (SAW) resonators. The former devices are rather bulky, whereas the latter are smaller but have higher insertion loss (generally >2 dB). As a result, neither provides an ideal solution for band selection in small communications devices such as mobile phones. Filters for such applications need deep stop-bands to reject unwanted signals, as well as low pass-band insertion loss (typically <2 dB) to achieve adequate signal-to-noise ratio in receivers or low power consumption in transmitters. There is therefore a requirement for very small resonators with high Q-factor (typically >500). To achieve this aim, with potential for integration on silicon, thin-film BAW resonators have been proposed. The advantage of BAW technology is that devices are small, have good power handling (>1 W), cover the frequency range 0.5-20 GHz, and can exploit wafer-scale processing and packaging on silicon.

Radio frequency filters based on thin-film bulk-acoustic-wave resonators are therefore appropriate for applications in mobile phones and wireless connectivity, such as GSM, W-CDMA, Bluetooth, Home-RF, DECT and GPS.

Filters are typically made up of a number of resonators. One conventional thin-film BAW filter configuration is a ladder construction, as shown in simplified schematic form in FIG. 1. This ladder-type filter has alternating series sections and shunt sections, each of which can be a single resonator, or one or more resonators on the same frequency connected in series or parallel, which is electrically equivalent.

To achieve minimum filter insertion loss at a given frequency the anti-resonant frequency of the shunt elements and the resonant frequency of the series elements are chosen to be equal to that frequency.

A T-section, comprising two series connected resonators and an intermediate shunt resonator connected between the junction of the two series resonators and the ground, may be considered as the basic building block of a ladder filter. A single resonator element is then connected to each of the input and output terminals of the filter, and each of the intermediate series resonators elements comprises one or more series connected resonators.

Due to the requirements such as high receiver sensitivity or low transmitter power consumption an RF filter must have very low pass-band insertion loss. However, to achieve adequate rejection in the stop-band several filter sections are typically required, and each section adds insertion-loss in the pass-band. Therefore it is necessary to minimize the pass-band insertion loss of each section.

Here, the dimension of each resonator measured in the direction parallel to a line between input and output of the filter is defined as the "width" of the resonator, and the other dimension is defined as the "length" of the resonator. Resonator "aspect ratio" is defined as the ratio of length to width. Resonator "effective area" is defined as the area of overlap between top and bottom electrodes. Typically the effective areas of shunt and series resonators are approximately equal.

According to the invention, a ladder filter is provided comprising a plurality of thin film bulk acoustic wave resonators, the resonators comprising a plurality of series resonators in series between an input terminal and an output terminal of the filter, and one or more shunt resonators each connected between a junction between two series resonators and a common terminal, the series resonators comprising an input series resonator connected to the input terminal and an output series resonator connected to the output terminal, and wherein the shunt resonators are designed to have unity aspect ratio of their effective area and wherein the series resonators are designed to have aspect ratio of their effective area different from unity.

The gist of the invention is to propose a design for a thin-film BAW filter for achieving minimal insertion loss, based on an understanding of the relationship between particular loss mechanisms in resonators, resonator aspect ratio and the role that each resonator plays in filter performance.

This understanding leads to the principle claim of this proposal, which is a ladder-type filter layout in which shunt resonators have unity aspect ratio and series resonators have aspect ratio significantly different from unity.

According to a preferred embodiment in the ladder filter a filter section comprises at least two series resonators and a shunt resonator.

Especially preferred is a ladder filter, wherein the input terminal, the output terminal, the top electrodes of the resonators together with the common terminal are arranged in a first metallization pattern with desired widths and lengths of the resonators and terminal sizes and the resonator bottom electrodes are arranged in a second staggered fan-shaped metallization pattern, the effective resonator area being defined by the respective overlap of first and second metallization pattern.

A ladder filter of such layout meets very well the recent trend to miniaturization, as it occupies a minimal base area.

Higher performance is achieved by realizing such a system, with low power consumption, better signal integrity and smaller size. Combining more functions on a smaller area not only reduces system size but it reduces the power consumption because signals don't have to pass long distances where parasitics are inevitably larger.

According to one embodiment of the invention, the widths of the series resonators $w_{series}$ is two-thirds the width of the shunt resonators $w_{shunt}$ and the length of the series resonators $l_{series}$ is one-and-a-half-times the width of the shunt resonators $w_{shunt}$.

The invention is also concerned with a radio frequency band-pass filter comprising a ladder filter according to the invention and a radio frequency receiver and/or transmitter device comprising such RF band-pass filter.

DETAILED DESCRIPTION

The filters according to the invention are configured as so-called ladder filters, wherein a plurality of series resonators is connected between the input and output terminals of the filter, and a plurality of shunt resonators connected between each pair of series resonators and the common ground terminal.

In bulk acoustic wave filters the required conversion between electrical and mechanical energy is achieved by a layer of piezoelectric material, for example zinc oxide, aluminium nitride, PZT, PLZT, between two metal layers in which electrodes are formed. Especially preferred are thin-film bulk acoustic wave resonators.

Within a thin-film bulk acoustic wave filter the acoustic waves must be acoustically isolated from the substrate to achieve a high Q device. To provide such acoustic isolation in a BAW resonators, inter alia Bragg reflector resonators and membrane resonators are known.

In a membrane type BAW resonator, the resonator section is deposited on a membrane, made from one or more layers of different materials. Acoustic waves excited in the piezoelectric layer are reflected back from the air interface above the top electrode, and from the air interface below the bottom electrode.

In a Bragg reflector type of BAW resonator, the resonator is solidly mounted on top of a stack of layers making up what is called an acoustic mirror. The layers of the mirror are selected to present alternately high and low acoustic impedance to acoustic waves excited in the piezoelectric layer. Each layer of material in an acoustic mirror has a thickness typically equal to one quarter of a longitudinal acoustic wave in that material. Such an acoustic mirror provides for nearly total reflection of acoustic waves excited in the piezoelectric layer and propagating in the direction of the acoustic mirror. There is also total reflection of the acoustic waves excited in the piezoelectric layer at the air interface at the top electrode.

FIGS. 4 and 5, respectively, show examples of membrane and Bragg-reflector resonators in a side view and a top view. Both employ a piezoelectric layer 3, typically c-axis orientated A1N of the order of 1 micrometer thick, sandwiched between two metal electrode layers 1, 2 each typically of the order of 0.1 micrometer thick, to provide the main resonator function. The overlay 4 shown, typically SiO2, is for frequency adjustment, where required, provided by its mechanical loading effect. FIG. 4 shows a configuration where access to the bottom electrode 2 is provided by a via 5.

FIG. 5 shows an alternative configuration of the top and bottom electrodes, where the resonator is implemented as two identical resonators R1, R2 in series with a floating central electrode 2 in the bottom metallization layer. This arrangement avoids the via, but adds the cost of a fourfold increase in area.

Both types of resonator electrode configuration may be implemented in either the membrane or Bragg-reflector structure.

A BAW resonator is essentially an acoustic cavity comprising a piezoelectric layer sandwiched between metal electrode layers.

The principle mode of vibration in practical thin-film resonators is the fundamental thickness-extensional (TE) acoustic mode, i.e. vibration is normal to the layers. Thus when an alternating electrical signal, at the frequency for which the wave length of the thickness-extensional acoustic mode is approximately twice the piezoelectric layer thickness, is applied between the two electrode layers a standing acoustic wave, which is characterized by alternating extension and compression in the thickness direction is strongly excited. Other orientations of the piezoelectric layer or materials of alternative crystallographic symmetry would give rise to other acoustic modes.

A commonly-used electrical equivalent circuit of a BAW resonator is shown in FIG. 2. $C_o$, $C_l$, $L_l$ and $R_l$ respectively characterize the static capacitance, motional capacitance, motional inductance and motional resistance of the resonator itself, and together form the so-called Butterworth-Van Dyke model. The remaining components are electrical parasitics. The three resistors characterize distinct types of energy loss: ohmic loss in the electrodes and interconnect ($R_s$), loss due to stray electric fields in the substrate ($R_p$), and mechanical losses associated with the resonance ($R_l$). Dielectric loss is typically negligible.

These loss mechanisms are central to what is proposed here. The equivalent-circuit model is useful for first-pass design of filters (and other circuits using BAW resonators). A more physically-based representation of a BAW resonator is the Novotny-Benes model. This provides a solution of the field equations in one dimension (1D). It is assumed that the mechanical and electrical fields have significant spatial variations only in the thickness direction. Since the lateral dimensions of a typical resonator are much greater than layer thicknesses this is a reasonable approximation. The measured conductance G(f) (real part of admittance) of a typical BAW resonator is compared over a wide band with predictions by both models in FIG. 6. The level of agreement for the susceptance B(f) (imaginary part) is similar. The electrical parasitic components $R_s$, $L_s$, $R_p$ and $C_p$ are included in both models. Most, but not all, features of the response are predicted by the 1D physical model.

Thin-film BAW filters are implemented by inter-connecting thin-film BAW resonators. According to the invention the architecture is the ladder filter, for which an example schematic circuit is shown in FIG. 1.

Each ladder section comprises at least one series resonator and a shunt resonator. In a typical design the thickness of the piezoelectric layer of each resonator is finely adjusted so that the resonance frequency of the resonators in the series branches corresponds to the anti-resonance frequency of the resonator in the parallel shunt branches. The band-pass filter characteristics are obtained by appropriate filter design.

For filter design, two characteristic frequencies are particularly important: the resonance $f_r$ and anti-resonance $f_a$, the frequencies of maximum and minimum admittance respectively. For high Q-factor resonances these are very close to the maximum and minimum of conductance. In the resonator example, whose response is shown in FIGS. 6, 7, and 8, they are at approximately 1.985 GHz and 2.03 GHz respectively. FIG. 7 shows an expanded view of the curves shown in FIG. 6 close to $f_r$. The detailed behavior near resonance is shown to be quite accurately predicted by both models. FIG. 7 shows the very fine detail near $f_a$ and this demonstrates a small but significant area of disagreement. The measured response clearly shows some ripple and additional conductance (i.e. loss) near $f_a$. This is predominantly due to closely-spaced weakly-excited modes which contain transverse field components, and fields with transverse as well as normal spatial variation. They are not accounted for in either of the above models. However, they cannot be ignored in filter design because energy loss at anti-resonance has a serious impact on filter performance. It would be possible to include these additional unwanted modes by extending the physical model to 2D or 3D, but they can also be approximated in the equivalent-circuit model as shown in FIG. 3, where each of the parallel branches (j=2,3 . . . J) corresponds to an unwanted mode. The j-th mode is then characterized by the motional parameters $C_j$, $L_j$ and $R_j$.

The number of ladder sections of a filter (each comprising series and shunt resonators) depends on the desired selectivity and other design considerations. For RF filters the required very low insertion loss may be achieved by designing the series resonators to have very high conductance (ideally infinite) at the filter center frequency $f_o$, and the shunt resonators to have very low conductance (ideally zero) at $f_o$. For minimum possible loss both $f_r$ of the series resonators and $f_a$ of the shunt resonators should be coincident with $f_o$. However, for certain applications it is possible to sacrifice some insertion loss performance in order to achieve wider bandwidth. In either case the conductance of the series resonators at $f_r$ should be as high as possible (typically>1 S for a 50 ohm filter), and the conductance of the shunt resonators at $f_a$ should be as low as possible (typically<1 mS for a 50 ohm filter). The prototype resonator used as an example here approaches these targets.

In high Q-factor devices energy loss near resonance or anti-resonance is only a very small fraction of stored energy. This cannot be accurately predicted from first principles, partly because sufficiently accurate material loss data is not available, and partly (in the case of the two above models) the loss mechanisms are not included.

However, realistic values for the resistors (and other components) in the equivalent-circuit model in FIG. 2 may be readily extracted from measurement by using simple circuit theory and adjusting the component values to give the agreement shown in FIGS. 6,7 and 8. For example, assuming high Q-factor, circuit theory leads to the relationships, $f_r \approx 1/\sqrt{(L_l C_l)}$ and $f_a \approx \sqrt{[(C_o+C_l)/(L_l C_l C_o)]}$. Substrate losses are typically very low giving a very high value of $R_p$, and therefore the values of conductance $G(f_r)$ and $G(f_a)$ at the two resonant frequencies are approximately $1/[R_s+R_l]$ and $1/[R_s+1/(4\pi^2 C_o^2 R_l)]$ respectively. In principle, component values for the extended circuit model in FIG. 3 could be extracted by matching the ripple near $f_a$ shown in FIG. 8. It is found in practice that, in the above expressions for conductance, the first term in the denominator (i.e. $R_s$) dominates at $f_r$ and the second term (i.e. $1/(4\pi^2 C_o^2 R_l)$) dominates at $f_a$. The expressions for conductance at $f_r$ and $f_a$ given by the extended circuit are much more complex, but the same general conclusion that electrical loss dominates at $f_r$ and mechanical loss at $f_a$ is still reached. Therefore optimum low-loss filter design implies different criteria for the design of the series and shunt resonators. Optimum design is not achieved by applying the same design criteria to all resonators.

From the above discussion it follows that, for series resonators minimizing conductor resistance is the most important consideration. On the other hand, for shunt resonators minimizing mechanical loss at anti-resonance is the most important consideration. Clearly, the mechanical loss associated purely with the wanted mode must be minimized, i.e. $R_l$ must be as small as possible. However, referring to the equivalent circuit in FIG. 3, even if $R_l$ is indeed small, the contribution to a shunt resonator's conductance at $f_a$ from it $j^{th}$ (unwanted) mode will be significant if its frequency is close to $f_a$ and the value of $R_j$ is sufficiently high (i.e. its Q-factor is sufficiently low) such that its contribution adds significantly to that of the wanted mode. The measurement curves in FIG. 6 and FIG. 8 demonstrates this clearly. In principle, all unwanted modes contribute to some extent towards increasing the conductance at anti-resonance, so for shunt resonators loss of energy into unwanted modes must be minimized.

In filter design resonator effective area is fixed by the desired impedance, which is inversely proportional to the area of the resonator area. Second-order aspects of behavior can however be influenced by resonator shape. Excitation of unwanted modes is generally associated with electrode edges, so mechanical energy lost is strongly related to the length of the perimeter of the resonator. Stored energy, on the other hand, is related to resonator area. Therefore Q-factor at anti-resonance is maximized for a resonator shape that maximizes the ratio of area to perimeter. This has been confirmed experimentally. Shunt resonators should therefore ideally be circular. If, for any reason such as compactness of layout, a rectangular shape is preferred, then shunt resonators should be square. Any resonator can in principle be split into more than one in series or parallel. Applying the criteria discussed here shunt resonators should not be divided into parallel devices since these will have smaller area, but creating say two in series as in FIG. 5 is advantageous since each then has twice the area of the original.

According to the invention it has been found, that the above considerations are much less significant in the design of the series resonators, for which the mechanical loss is typically substantially less than the conductor loss. Thus, the resistance of the path taken by the electrical current through the chain of series resonators should be minimized. This may be achieved by making the dimension corresponding to this longitudinal direction, defined above as the resonator width, small, with the transverse dimension, defined above as the resonator length, being correspondingly large, so as to retain the required impedance level. In practice, there will be a limit to aspect ratio, because beyond a certain value corresponding to resonators with very narrow width the mechanical loss at $f_r$ will become significant compared to the electric loss.

For purposes of distinguishing the invention clearly from the prior art, ladder-type filters comprising BAW resonators according to the invention are shown in FIGS. 10, 11, 12.

A thin-film BAW ladder-type filter according to the invention comprises sets of interconnected resonators formed in a layered thin-film structure. As has already been explained, each bulk acoustic wave resonator comprises at least two electrodes, a top electrode and a bottom electrode. The effective resonator area is defined as the overlapping area of top and bottom electrode, when the two electrodes are projected in a plane.

Every bulk acoustic wave resonator therefore has a specific effective area, which is characterized by geometric shape and size of its electrodes.

The electrodes together with the conductive interconnections are formed from metallization layers in the thin-film structure. When a BAW filter consisting of at least one pair of series and shunt BAW resonators, is fabricated based on thin-film technology including one or more metallic layers mounted on a single substrate, the metallic layers are patterned into a metallization pattern, so as to form the electrodes of the resonators and the conductive interconnections.

FIG. 9 shows a structure where the layers are consecutively deposited in thin-film technology and the metallic layers are patterned into electrodes. It shows a cross section of the layer stack of a thin-film bulk acoustic wave filter comprising a top metallization layer 1 and a bottom metallization layer 2 on both sides of a piezoelectric layer 3, an isolation structure such as an acoustic mirror 4 and a substrate 5.

FIG. 10 shows the physical layout of both top and bottom metallization patterns of a first embodiment of the invention based on the design criteria of the invention. The top metallization layer 1 is typically aluminum (Al), or molybdenum (Mo), and the bottom metallization layer 2 is typically platinum (Pt), or aluminum (Al), or molybdenum (Mo).

The input terminal, the output terminal, the top electrodes of the resonator together with the common terminal are arranged in a first metallization pattern with the desired widths and lengths of the resonators and terminal pad sizes, and the resonator bottom electrodes are arranged in a second metallization pattern which is staggered giving a fan-shaped appearance, where the degree of staggering depends on the relative widths of the series and shunt resistors. The resonator area being defined by the respective overlap of first and second metallization.

Each series resonator of the schematic, except those adjacent to the input or output terminal being implemented as two physical resonators in series. The two input and output terminals are on the left and right top ends of the layout. The two signal input and output grounds are on the left and right bottom ends of the layout. As shown the two ground connections are connected to each other.

In a preferred embodiment the widths of the series resonators $w_{series}$ are two-thirds the widths of the shunt resonators $w_{shunt}$ and the lengths of the series resonators $l_{series}$ are one-and-a-half-times the widths of the shunt resonators $w_{shunt}$. FIGS. 11 and 12 show variants of the above design.

The different aspect ratios required for optimum performance of the series resonators (A) and shunt resonators (B) are taken into account in the fan-shaped layout shown. Areas on the left and right sides of the layout where the top metal does not overlap the bottom are input, output and ground pads. Typically these areas have an additional thick metal layer applied. This further reduces series resistance and facilitates connections (e.g. flip-chip). Where possible edges of areas of overlap are defined by electrode edges in the top layer. For such edges, there is no physical discontinuity in the piezoelectric layer, so conversion of energy into unwanted modes should at least be minimized. The variant in FIG. 11 has elongated holes in the top layer to increase the proportion of the shunt resonator edge length defined in this way. Since holes also increase resistance they are likely to be counter-productive for the series resonators, and are therefore omitted from this part of the layout. Another variant, shown in FIG. 12, has rounded corners to further reduce abrupt physical discontinuities.

Variants with circular shunt electrodes, and/or shunt resonators implemented using two or more in series may also be considered, although the implications for total area and degree of fan-out must be taken into account. In addition to the unwanted modes excited by the resonator itself, other modes may be excited by stray electric fields penetrating the piezoelectric layer. Therefore, the length of interconnect lines in either of the metal layers should be as short as possible in order to minimize both this source of energy loss and resistive losses.

DRAWINGS

Figure 1:
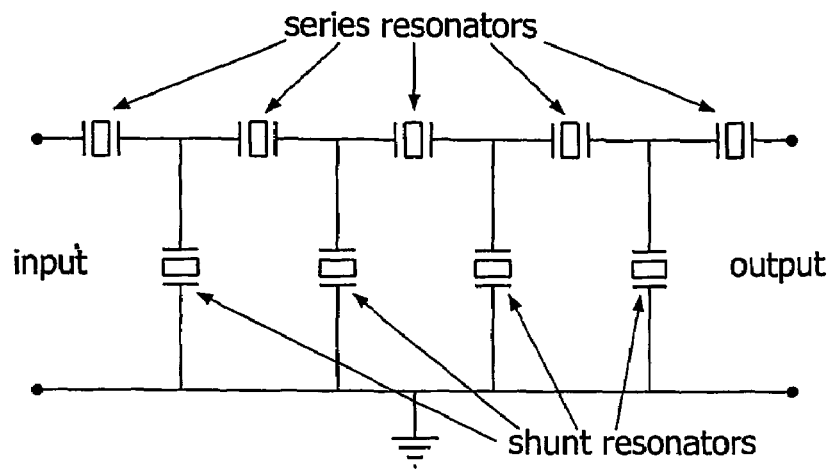
FIG. 1 is an equivalent circuit diagram showing a ladder-type filter in which the piezoelectric resonators according to the invention are combined.
Figure 2:
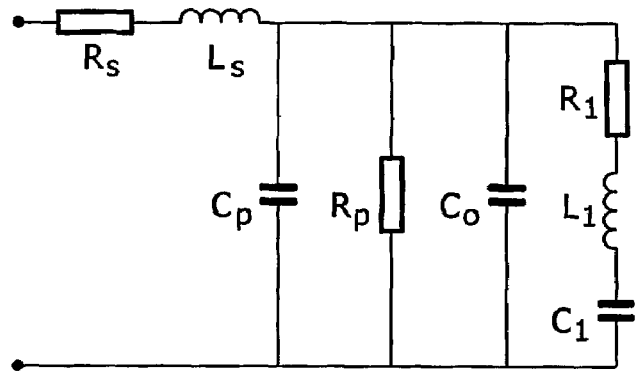
FIG. 2 is a Butterworth-Van Dyke BAW resonator model with added parasitics
Figure 3:
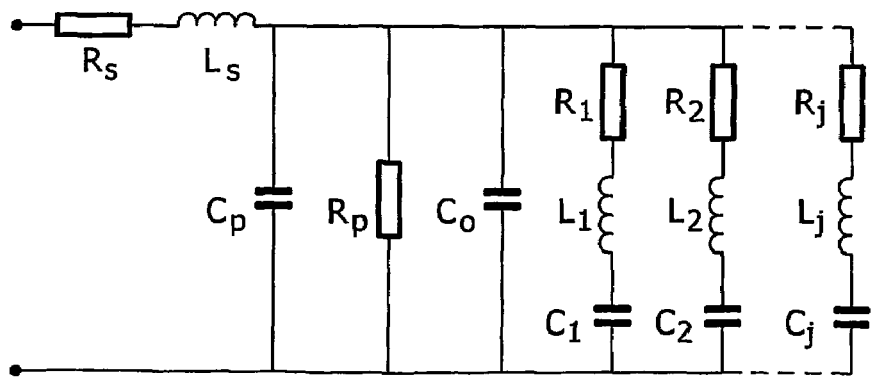
FIG. 3 is an extended Butterworth-Van Dyke BAW resonator model.
Figure 4:
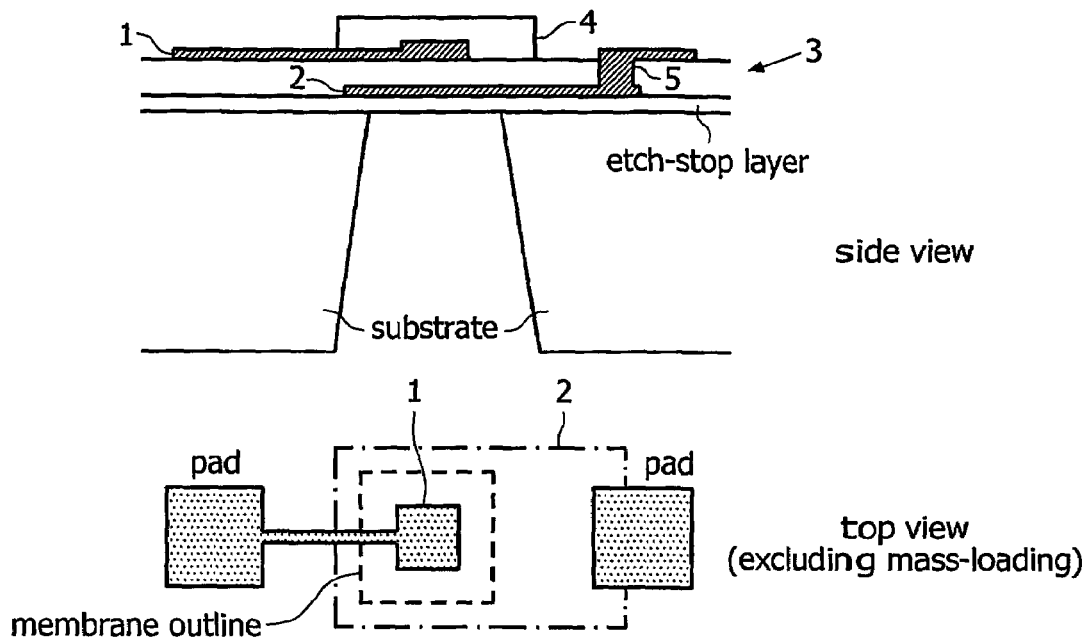
FIG. 4 shows an example of a membrane resonators in a side view and a top view.
Figure 5:
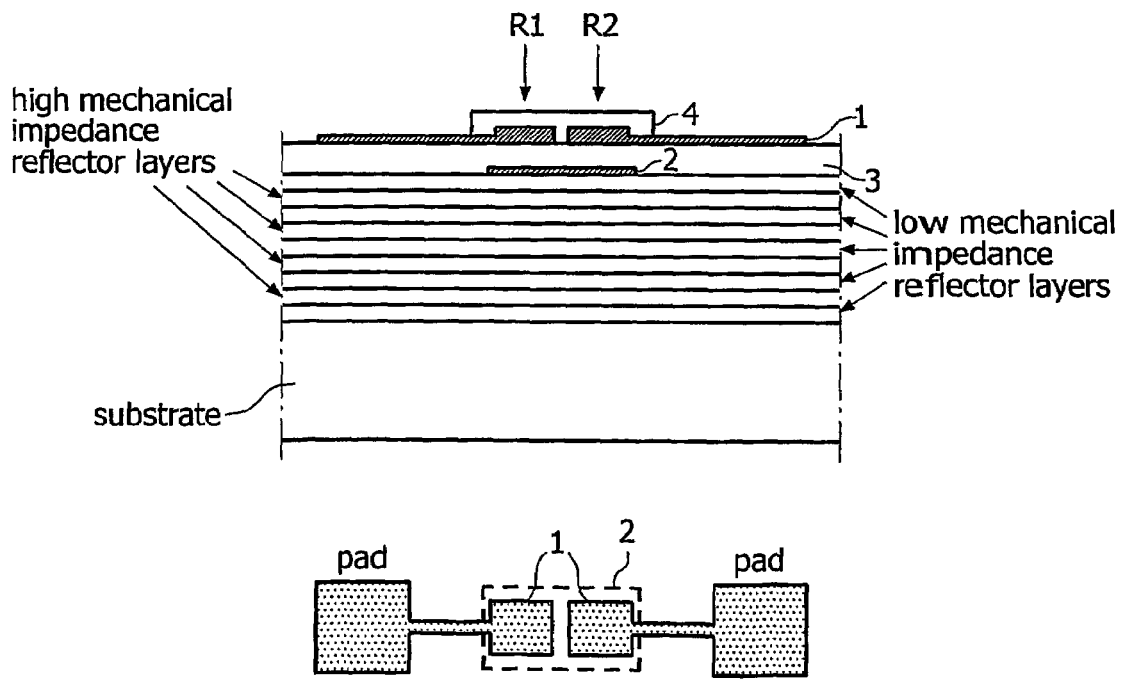
FIG. 5 shows an example of a Bragg-reflector resonator in a side view and a top view.
Figure 6:
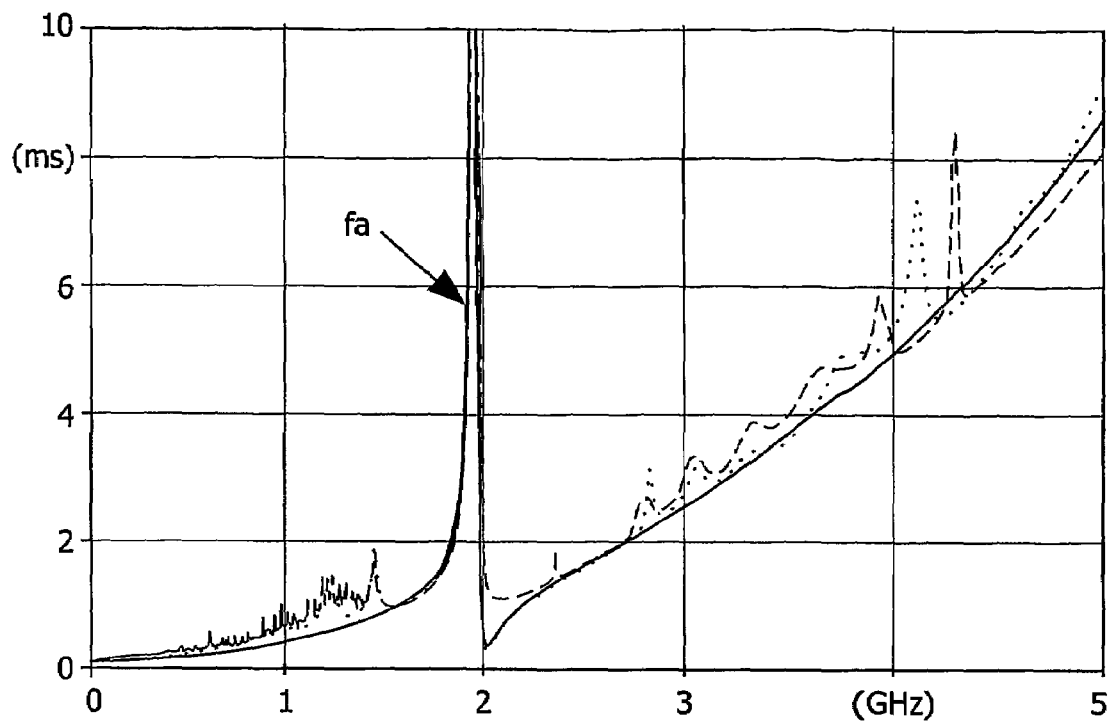
FIG. 6 is a graph showing the conductance G(f) over wide band: measured (dashed line), circuit model (solid line), physical model (dotted line).
Figure 7:
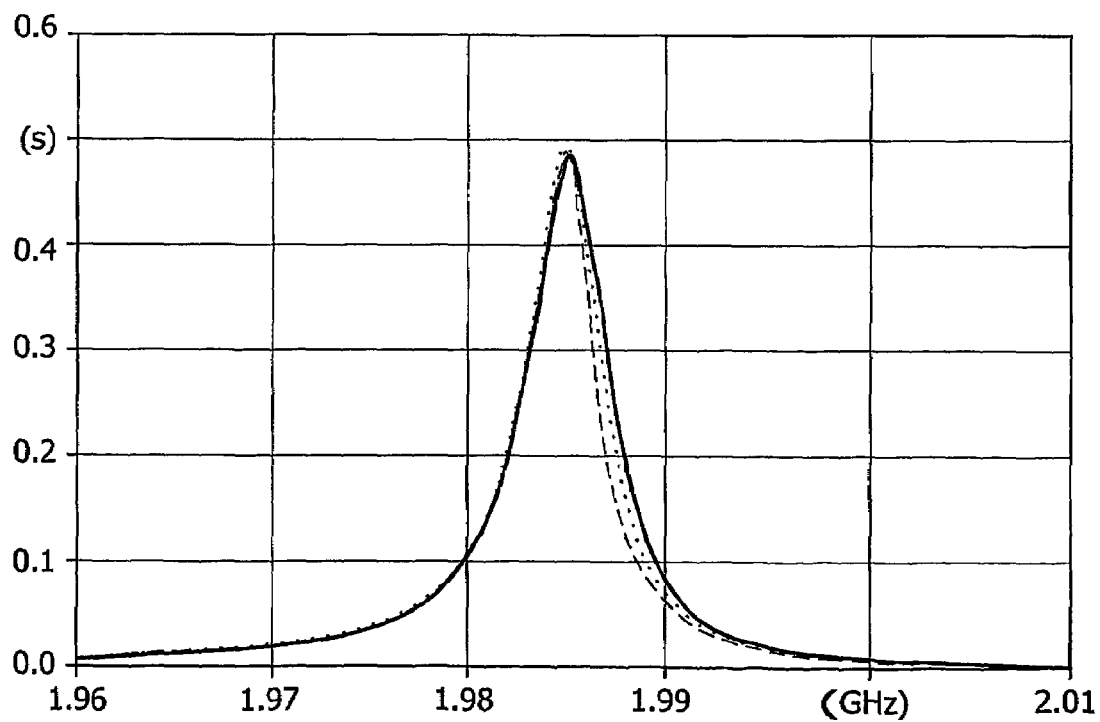
FIG. 7 is a graph showing the conductance G(f) close to $f_r$: measured (dashed line), circuit model (solid line), physical model (dotted line)
Figure 8:
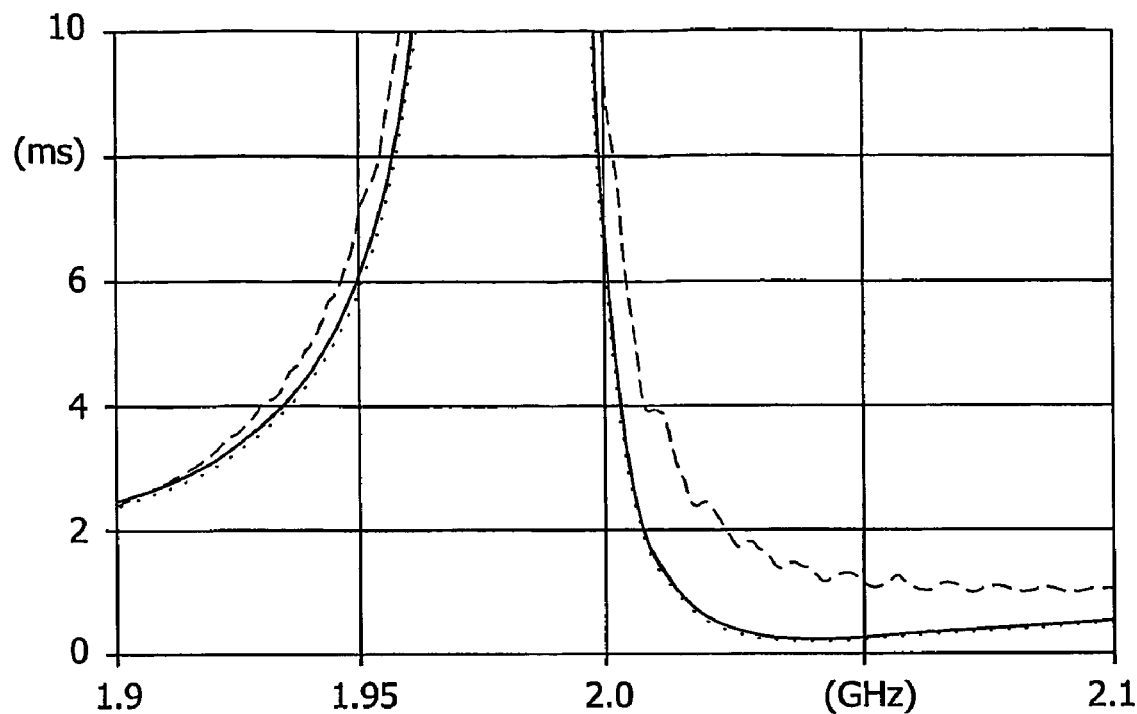
FIG. 8 is a graph showing the conductance G(f) characteristic close to $f_a$: measured (dashed line), circuit model (solid line), physical model (dotted line).
Figure 9:
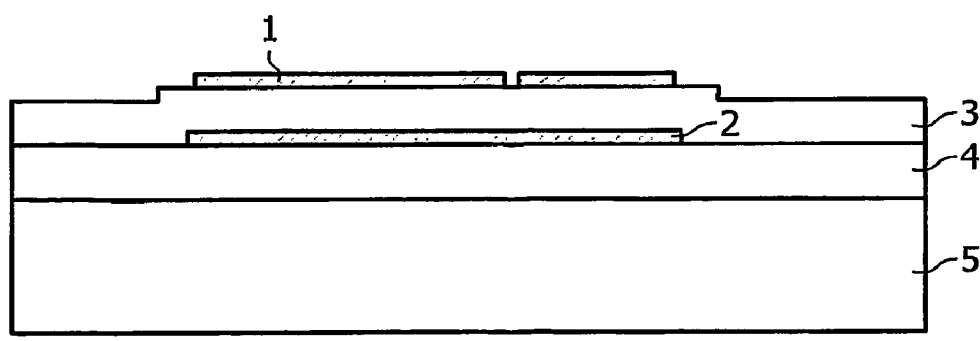
FIG. 9 shows a cross section of the layer stack of a thin film bulk acoustic wave filter.
Figure 10:
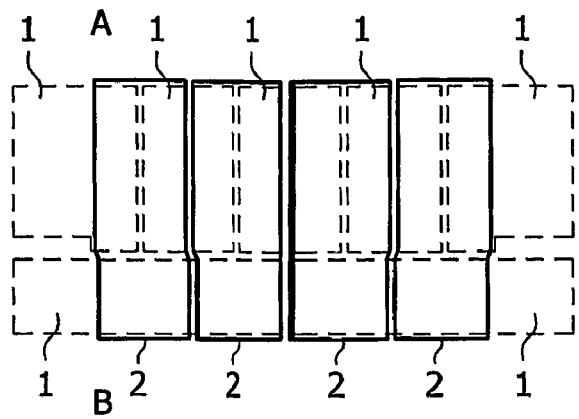
Figure 11:
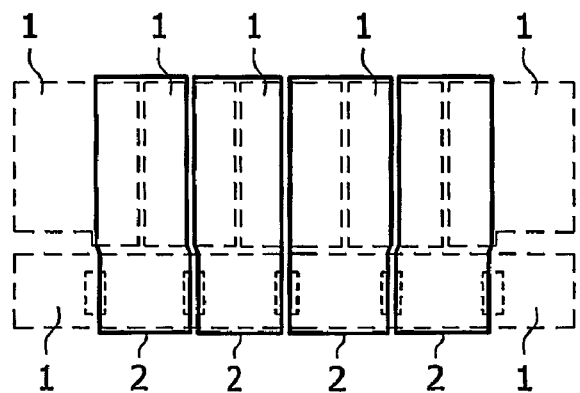
Figure 12:
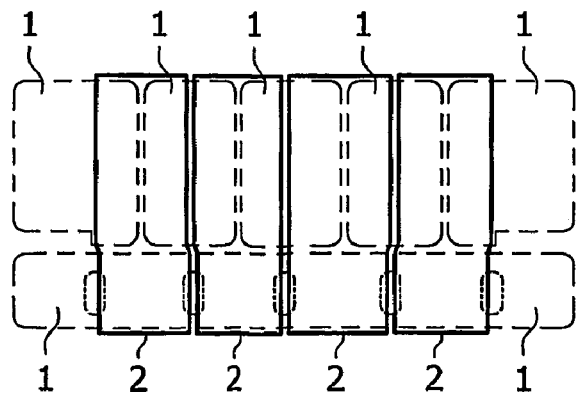

FIGS. 10, 11, 12 each shows the layout of the metallization layers in one embodiment of the fan-shaped ladder filter.

The invention claimed is:

1. A ladder filter comprising a plurality of bulk acoustic wave resonators, each bulk acoustic wave resonator comprising at least one piezoelectric layer between a bottom electrode and a top electrode, the plurality of resonators comprising in one or more filter sections plurality of series resonators in series between an input terminal and an output terminal of the filter, and one or more shunt resonators each connected between a junction between two series resonators and a common terminal, the series resonators comprising an input series resonator connected to the input terminal and an output series resonator connected to the output terminal, and wherein the shunt resonators are designed to satisfy a unity aspect ratio and wherein the series resonators are designed to satisfy an aspect ratio different from unity;

wherein the input terminal, the output terminal, the top electrodes of the resonators together with the common terminal are arranged in a first metallization pattern with the desired widths and lengths of the resonators and terminal sizes and the resonator bottom electrodes are arranged in a second staggered fan-shaped metallization pattern, the resonator area being defined by the respective overlap of first and second metallization;

wherein the widths of the series resonators $w_{series}$ is two-thirds the widths of the shunt resonators $w_{shunt}$ and the lengths of the series resonators $l_{series}$ is one-and-a-half-times the widths of the shunt resonators $w_{shunt}$.

2. A ladder filter according to claim 1, wherein a filter section comprises at least two series resonators and a shunt resonator.

3. A radio frequency band-pass filter comprising a ladder filter as claimed in claim 1.

4. A radio frequency receiver and/or transmitter device comprising a radio band-pass filter as claimed in claim 3.

* * * * *